United States Patent [19]
Alig et al.

[11] 3,978,436
[45] Aug. 31, 1976

[54] SURFACE ACOUSTIC WAVE DEVICE AND METHOD OF MAKING SAME

[75] Inventors: Roger Casanova Alig, Hightstown; Lubomyr Stephen Onyshkevych, Lawrenceville, both of N.J.

[73] Assignee: RCA Corporation, New York, N.Y.

[22] Filed: Nov. 10, 1975

[21] Appl. No.: 630,761

[52] U.S. Cl. .............................. 333/30 R; 29/25.35; 310/9.7; 333/72
[51] Int. Cl.² ..................... H03H 9/04; H03H 9/14; H03H 9/30; H01L 41/10
[58] Field of Search........... 333/30 R, 72; 29/25.35, 29/594; 310/8, 8.1, 8.2, 8.3, 9.6, 9.7, 9.8

[56] References Cited
UNITED STATES PATENTS
3,942,048  3/1976  Laude et al. ....................... 310/8.1

OTHER PUBLICATIONS
Carr–"The Generation and Propagation of Acoustic Surface Waves at Microwave Frequencies" in IEEE Transactions on Microwave Theory and Techniques vol. MTT-17, No. 11, Nov. 1969; pp. 845-855.

Primary Examiner—Alfred E. Smith
Assistant Examiner—Marvin Nussbaum
Attorney, Agent, or Firm—Glenn H. Bruestle; Arthur E. Wilfond; Ronald L. Yin

[57] ABSTRACT

A piezoelectric body has a transducer on one surface. The transducer includes an electrically insulating body on the piezoelectric body; the electrically insulating body has a surface relief pattern on a surface which is opposite the piezoelectric body. An electrically conductive layer is on the electrically insulating body on the surface having the relief pattern thereon.

The transducer can be formed by means of a master body. A surface of the master body, having a relief pattern thereon, is pressed against the electrically insulating body to form a relief pattern on the electrically insulating body. The electrically conductive layer is then formed on the electrically insulating body on the surface having the relief pattern thereon.

9 Claims, 2 Drawing Figures

SURFACE ACOUSTIC WAVE DEVICE AND METHOD OF MAKING SAME

BACKGROUND OF THE INVENTION

The present invention relates to a surface acoustic wave device and more particularly to a surface acoustic wave device using a type of transducer known as washboard transducer. The present invention also relates to a method of making the surface acoustic wave device.

Heretofore some surface acoustic wave devices use surface acoustic wave transducers which are metal electrodes shaped in a single phase grating pattern or in an interdigital grating pattern (see for example, U.S. Pat. No. 3,805,195, issued to Arthur Miller on Apr. 16, 1974). Transducers shaped in these patterns have limitation in use caused by the inherent design of these patterns. The frequency of a surface acoustic wave generated by a transducer shaped in a single phase grating pattern is limited by the spatial separation between pairs of adjacent electrodes. As the distance between adjacent electrodes decreases, the frequency of the surface acoustic wave generated by that transducer increases. However, difficulty had been encountered in constructing a single phase grating transducer with very small spatial separation between adjacent electrodes. Thus, one limitation imposed by the design of the single phase grating pattern, is the inability to generate high frequency surface acoustic waves.

Summary of the Invention

A surface acoustic wave device has a transducer on a piezoelectric body. The transducer comprises an electrically insulating body on the piezoelectric body; the electrically insulating body has a surface relief pattern on a surface opposite the piezoelectric body. An electrically conductive layer is on the electrically insulating body on the surface having the relief pattern thereon.

A method of making a surface acoustic wave device comprises providing an electrically insulating body on a piezoelectric body. The surface of a master body, having a relief pattern thereon, is pressed against the electrically insulating body on a surface opposite the piezoelectric body, to form a relief pattern on the electrically insulating body. A layer of electrically conductive material is applied on the electrically insulating body on the surface having the relief pattern thereon.

DETAILED DESCRIPTION OF THE DRAWINGS

Figure 1:
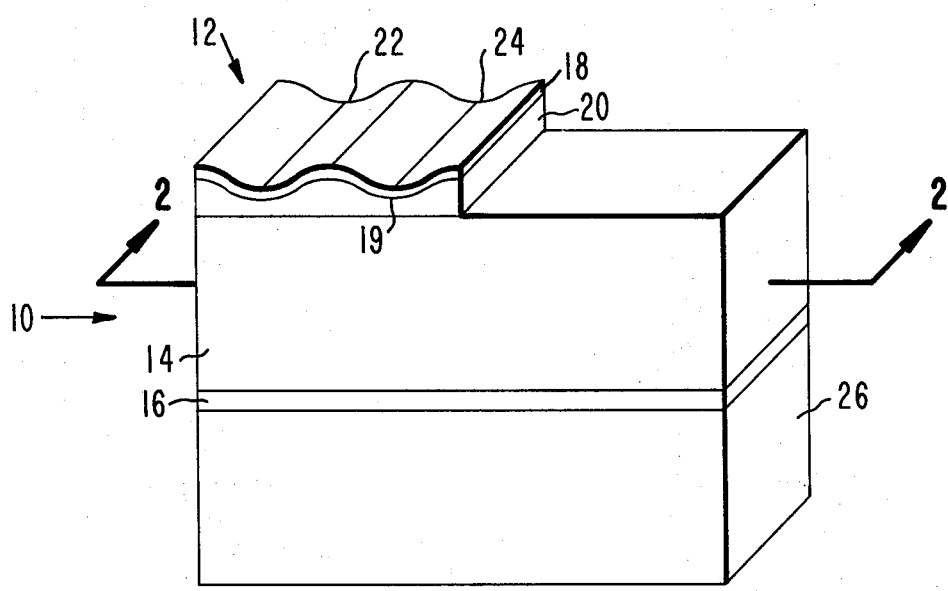
FIG. 1 is a perspective view of one embodiment of a surface acoustic wave device of the present invention.

Referring to FIG. 1, there is shown a perspective view of one embodiment of the surface acoustic wave device of the present invention, generally designated as 10. The surface acoustic wave device 10 comprises a piezoelectric body 14 on a substrate 26, which can be made from an electrically insulating material, such as lithium niobate or sapphire, with a planar electrode 16 interposed in a sandwich fashion between the piezoelectric body 14 and the substrate 26. A transducer 12 is on the piezoelectric body 14 on a surface opposite the planar electrode 16. The transducer 12 has an electrically insulating body 20, which can be made, for example, from resins, plastics, and glasses, and an electrically conductive layer 18, which can be made, for example, of a metal. The electrically insulating body 20 is on the piezoelectric body 14. The electrically insulating body 20 has a surface relief pattern on a surface 19, which is opposite the piezoelectric body 14. The conductive layer 18 is on the surface 19, having the surface relief pattern. The surface relief pattern on the surface 19 of the electrically insulating body 20 is shown as having hills and dales. The hills are the thickest relief portions whereas the dales are the thinnest relief portions. Because of the surface relief nature of the transducer 12, the term "washboard" is proposed. As shown in FIG. 1, the washboard transducer 12 comprises a first dale 22 and a second dale 24.

The surface acoustic wave device 10 can be made by depositing the planar electrode 16 on the substrate 26. The piezoelectric body 14 can be attached to the planar electrode 16 by any of the methods well known to those skilled in the art. The electrically insulating body 20 of the washboard transducer 12 can be sputtered onto the piezoelectric body 14. All of the foregoing depositing, attaching and sputtering steps are well known to those skilled in the art. The surface relief pattern on surface 19 of the electrically insulating body 20 can be made by pressing the surface of a master body having a surface relief pattern thereon, against the electrically insulating body 20. The electrically conductive layer 18 is formed over the surface 19 which has the relief pattern thereon. Since the conductive layer 18 can be a metal, any conventional metallizing process, such as sputtering, vapor deposition or chemical process, may be used.

In order for the master body to impress its surface, with the relief pattern thereon, on the electrically insulating body 20, the electrically insulating body 20 must be of a material which is softer than the master body, at the time the pressing action is performed. Thus, the electrically insulating body 20 can be of a material which is harder than the master body at low temperature but is softer than the master body at high temperature. The pressing action is performed when the electrically insulating body 20 is raised to a temperature such that it is softer than the master body. Once the relief pattern is formed on the electrically insulating body 20, the electrically insulating body is cooled. The surface relief pattern, which is impressed on the electrically insulating body 20, may be of any shape or design.

The method of the present invention permits mass manufacturing of the surface acoustic wave device of the present invention. The pressing action by the master body reduces cost and time in making the transducer 12.

Figure 2:
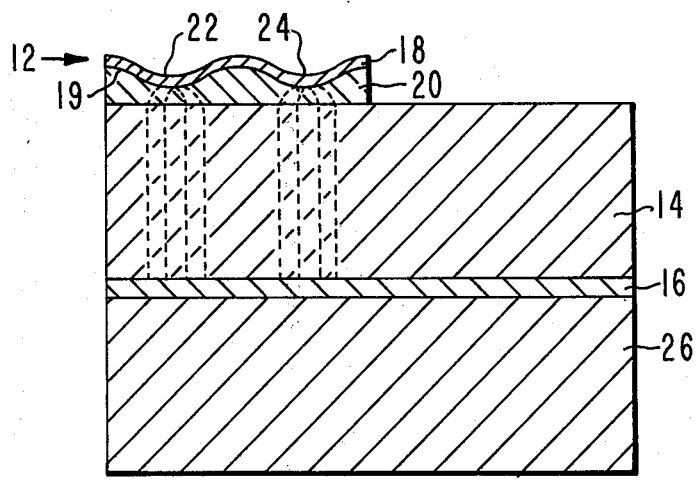
FIG. 2 is a cross-sectional view along plane 2—2 of the surface acoustic wave device of FIG. 1.

The operation of the surface acoustic wave device 10 can be understood by referring to FIG. 2. In a mode of operation, an electrical signal is applied to the planar electrode 16 and the electrically conductive layer 18. Near the planar electrode 16, the lines of electrical field are perpendicular to the planar electrode 16. Near the washboard transducer 12, the lines of electrical field bend and are directed towards the nearest dale. The bending of the lines of electrical field causes a stress in the structure of the piezoelectric body 14. The stress propagates an acoustic wave. If the body 20 were electrically conducting, then the lines of electrical field would not bend and would be perpendicular to the body 20 — similar to the lines of electric field near the planar electrode 16. Thus, the insulating body 20 must be of an electrically insulating material. Similar to the single phase grating transducer, the frequency limitation of the surface acoustic wave device 10 is determined by the spatial separation between the first dale 22 and the second dale 24. However, for high frequency applications where the spatial separation between adjacent dales must be small, the washboard transducer is easier to manufacture than the single phase grating transducer, operating at a similarly high frequency where the spatial separation between adjacent electrodes also must be small. As the number of dales increases with the same spatial separation between pairs of adjacent dales, the acoustic wave generated at the frequency corresponding to the spatial separation between pairs of adjacent dales, will be of a larger intensity. Thus, a washboard transducer with a periodic surface relief pattern having more than two dales will generate an acoustic wave which is stronger than an acoustic wave generated by a washboard transducer with only two dales. Moreover, the washboard transducer 12 can be used either as an input transducer, i.e. conversion of electrical signal to acoustic wave, or as an output transducer, i.e. conversion of acoustic wave to an electrical signal.

In FIGS. 1 and 2, the planar electrode 16 is shown as being on an electrically insulating substrate 26, the function of the insulating substrate 26 is to provide support. However, if the piezoelectric body 14 is thin (on the order of one acoustic wave length) and the substrate 26 has elastic properties similar to the piezoelectric body 14, then the substrate 26, in addition to providing support, also provides a medium for the propagation of the surface acoustic wave. The acoustic wave generated by the planar electrode 16 and the electrically conductive layer 18 would penetrate the planar electrode 16 and propagate in the piezoelectric body 14 and the substrate 26.

What is claimed is:

1. A surface acoustic wave device comprising:
a piezoelectric body; and
a transducer on one surface of said piezoelectric body, said transducer having an electrically insulating body on said piezoelectric body with a surface relief pattern on a surface opposite said piezoelectric body, a layer of conductive material on said surface, having the surface relief pattern thereon.

2. A surface acoustic wave device in accordance with claim 1, wherein said layer of conductive material is a metal.

3. A surface acoustic wave device in accordance with claim 2, wherein said surface relief pattern is periodic.

4. A surface acoustic wave device in accordance with claim 3 further comprising a planar electrode on a surface of said piezoelectric body opposite said transducer.

5. A surface acoustic wave device in accordance with claim 4 further comprising a substrate, said piezoelectric body on said substrate with said planar electrode interposed in a sandwich fashion between said piezoelectric body and said substrate.

6. A surface acoustic wave device in accordance with claim 5 wherein said substrate is made from an electrically insulating material.

7. A method of making a surface acoustic wave device, from a master body having a surface relief pattern on one surface of said master body, wherein said method comprises the steps of:
providing a body of electrically insulating material on a body of piezoelectric material;
pressing said one surface of said master body against said insulating body on a surface opposite said piezoelectric body, to form a relief pattern thereon; and
forming a layer of electrically conductive material on said relief pattern of said insulating body.

8. The method in accordance with claim 7 wherein said surface relief pattern of said master body is periodic.

9. The method in accordance with claim 8 wherein said layer of conductive material is a metal.

* * * * *